the layers, wherein the SiOF dielective layer includes a first region at one edge thereof which is depleted of fluorine to a predetermined depth.

(12) United States Patent
Huang et al.

(10) Patent No.: US 6,335,273 B2
(45) Date of Patent: *Jan. 1, 2002

(54) SURFACE TREATMENT OF LOW-K SIOF TO PREVENT METAL INTERACTION

(75) Inventors: Richard J. Huang, Cupertino; Guarionex Morales, Santa Clara; Simon Chan, Saratoga, all of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/443,376

(22) Filed: Nov. 19, 1999

Related U.S. Application Data

(62) Division of application No. 09/157,240, filed on Sep. 18, 1999, now Pat. No. 5,994,778.

(51) Int. Cl.[7] ............... H01L 21/4763; H01L 21/44; H01L 29/40
(52) U.S. Cl. ............ 438/622; 438/624; 438/683; 438/685; 438/687; 257/758
(58) Field of Search .................. 438/118, 622, 438/624, 683, 685, 687

(56) References Cited

U.S. PATENT DOCUMENTS

| 5,492,736 A | * | 2/1996 | Laxman et al. ............. 427/579 |
| 5,703,404 A | | 12/1997 | Matsuura ................... 257/758 |
| 5,753,564 A | * | 5/1998 | Fukada ....................... 437/238 |
| 5,753,975 A | | 5/1998 | Matsuno ..................... 257/751 |
| 5,789,315 A | | 8/1998 | Besser et al. ............... 438/624 |
| 5,937,323 A | * | 8/1999 | Orczyk et al. .............. 438/624 |
| 5,989,623 A | * | 11/1999 | Chen et al. .................... 427/97 |
| 6,042,901 A | | 3/2000 | Denison et al. ............ 427/579 |
| 6,051,321 A | * | 4/2000 | Lee et al. ................... 428/447 |
| 6,071,573 A | * | 6/2000 | Koemtzopoulos et al. .. 427/578 |

FOREIGN PATENT DOCUMENTS

JP          09275102    * 10/1997    ............... 438/661

* cited by examiner

Primary Examiner—Olik Chaudhuri
Assistant Examiner—Shrinivas H. Rao
(74) Attorney, Agent, or Firm—Foley & Lardner

(57) ABSTRACT

A method for using low dielective SiOF in a process to manufacture semiconductor products, comprising the steps of: obtaining a layer of SiOF; and depleting fluorine from a surface of the SiOF layer. In a preferred embodiment, the depleting step comprises the step of treating the surface of the layer of SiOF with a plasma containing hydrogen. It is further preferred that the treated surface be passivated. The invention also encompasses a semiconductor chip comprising an integrated circuit with at least a first and second layers, and with a dielective layer of SiOF disposed between the layers, wherein the SiOF dielective layer includes a first region at one edge thereof which is depleted of fluorine to a predetermined depth.

8 Claims, 2 Drawing Sheets

SURFACE TREATMENT OF LOW-K SIOF TO PREVENT METAL INTERACTION

This application is a divisional of application Ser. No. 09/157,240, filed Sep. 18, 1999 now U.S. Pat. No. 5,994,778.

BACKGROUND OF THE INVENTION

1. Field of the Invention

The present invention relates generally to the field of semiconductor chip processing, and more particularly, to the processing for an interlayer dielectric.

2. Description of the Related Art

Fluorinated $SiO_2$ (typically PECVD or HDP) can be used to lower the dielectric constant of $SiO_2$ from, for example, 4.0 to 3.6–3.8. The lowering of the dielectric constant is advantageous for a number of reasons, including to reduce the capacitance of the semiconductor device and thereby increase its performance.

However, fluorine in $SiO_2$ will react with PVD barrier metals (Ti, TiN, Ta, TaN, Al, Cu, etc.) which are subsequently deposited on the surface of the fluorinated $SiO_2$. This reaction between fluorine and the barrier metals will cause delamination on flat SiOF surfaces, as well as inside via holes.

SUMMARY OF THE INVENTION

Briefly, the present invention comprises, in one aspect, a method for using low dielectric SiOF in a process to manufacture semiconductor products, comprising the steps of obtaining a layer of SiOF; and depleting the fluorine from a surface of the SiOF layer.

In a further aspect of this inventive method, the depleting step comprises the step of treating the surface of the layer of SiOF with a plasma containing hydrogen to yield a treated surface.

In a yet further aspect of the present invention, the method comprises the step of passivating the treated surface.

In a further aspect of the present invention, the passivating step comprises the step of applying substantially pure nitrogen plasma to the treated surface.

In a yet further aspect of the present invention, the nitrogen plasma is applied at a lower plasma bias power and a higher pressure than the hydrogen-containing plasma used in the treating step.

In a further aspect of the present invention, the treating step is carried out in a CVD deposition chamber.

In a yet further aspect of the present invention, the depleting step forms a depletion layer that is greater Man or equal to 30 Angstroms in thickness.

In a further aspect of the present invention, the passivating step comprises the step of forming a passivation layer that is less than or equal to 25 Angstroms in thickness.

In a further embodiment of the present invention, a method is provided for using low dielectric SiOF in a process to manufacture semiconductor integrated circuit chips, comprising the steps of: obtaining a layer of SiOF; treating in a CVD-TiN deposition chamber a surface of the layer of SiOF with a plasma containing hydrogen to deplete fluorine from the surface; passivating the treated surface with substantially pure $N_2$ plasma; and depositing a layer of TiN.

In a yet further embodiment of the present invention, a semiconductor chip is provided comprising: an integrated circuit with at least a first and second layers, and with a dielectric layer of SiOF disposed between said two layers, wherein the SiOF dielectric layer includes a first region at one edge thereof which is depleted of fluorine to a predetermined depth.

In a further aspect of this inventive embodiment, the predetermined depth of the first region is greater than or equal to 30 Angstroms.

In yet a further aspect of the present invention, the depth of the second region is less than or equal to 25 Angstroms.

DETAILED DESCRIPTION OF THE PREFERRED EMBODIMENT

The present invention will be described in its context of use with an interlayer dielectric layer in a conducting layer stack on a semiconductor chip. However, the invention has broad application in any situation where SiOF is utilized as a layer.

Figure 1:
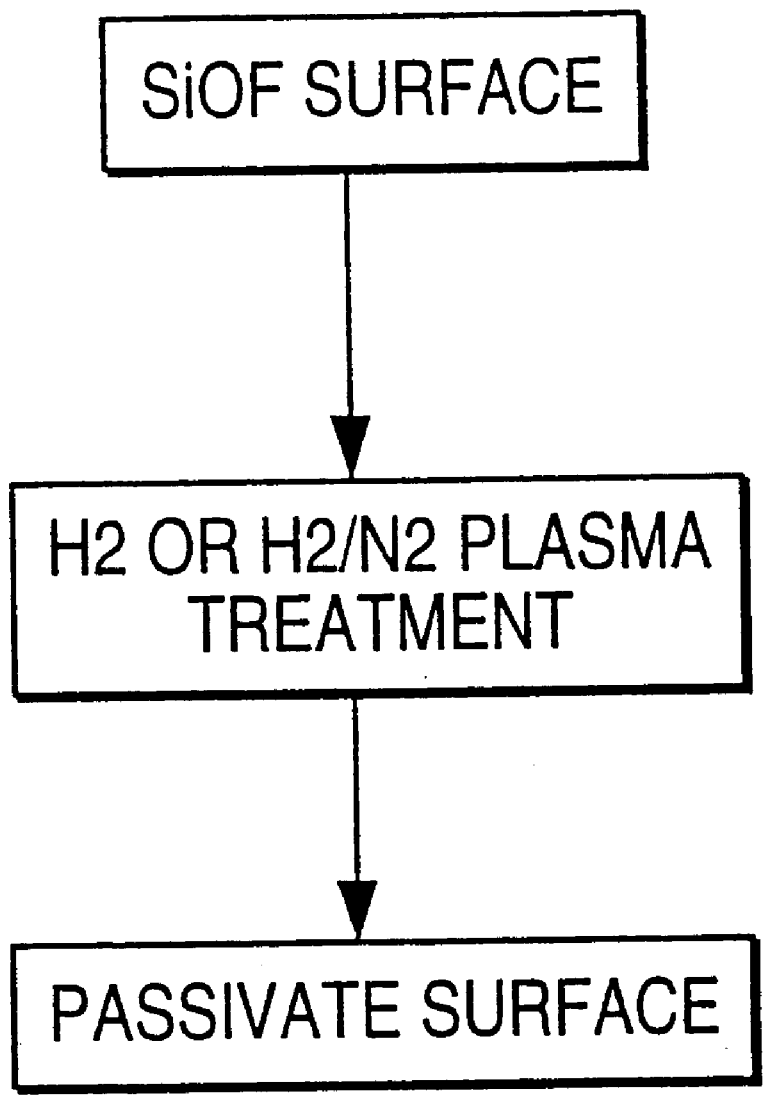
FIG. 1 is a process flow diagram for a method in accordance with the present invention.
Figure 2:
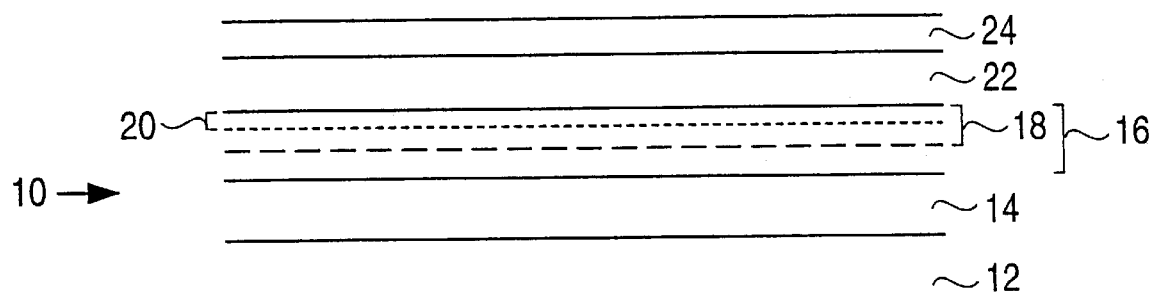
FIG. 2 is a cross-section of a select group of layers on a semiconductor chip.

Referring now to the drawings, FIG. 1 is a process flow diagram for a method in accordance with the present invention. FIG. 2 illustrates a semiconductor chip 10 in accordance with present invention comprising a bulk substrate and various process layers, designated generally by the numeral 12. A further layer 14 of same type is then deposited. By of example, this further layer 14 might be a conducting layer such as a metallic layer. For purposes of describing the present invention, an SiOF layer 16 is shown as being deposited on this layer 14. The SiOF layer 16 may be formed, by way of example, but not by way of limitation, by introducing a fluorine species during an $SiO_2$ PECVD or HDP. Typically, after this SiOF deposition step, vias are etched through the SiOF layer 16. This via etch step is followed by a resist strip step and a solvent clean step, in the well known manner.

The present invention then requires application of a process to deplete the fluorine from the top surface of the SiOF layer 16 to yield a depleted layer 18 having a desired thickness. In a preferred embodiment this thickness of the depleted layer 18 is equal to or greater than 30 Angstroms.

In a preferred embodiment, the step used to form the depletion layer 16 is accomplished by treating the surface of the SiOF layer 16 with a plasma containing hydrogen. For example, the plasma may be pure hydrogen, or it may be a diluted $H_2$ plasma, for example an $H_2/N_2$ plasma. The purpose of diluting the hydrogen plasma is to make the hydrogen less volatile.

The hydrogen in the plasma will bond with the fluorine atoms to form HF, which, because of its high vapor pressure and low boiling point, will be vaporized and evacuated from the system.

In a preferred embodiment, the hydrogen plasma treatment is performed in a CVD deposition chamber, such as, for example, an Applied Material CVD deposition chamber. The CVD chamber may be the same chamber used to be used to deposit a subsequent conducting layer, such as TiN. Preferably the CVD chamber for the plasma treatment should have a slightly elevated temperature (5–50° C. higher) relative to the temperature used to deposit the subsequent conducting layer. For example, if a temperature falling in the range of 375° C. to 450° C. is to be used to deposit a subsequent conducting layer 22, then a slightly elevated temperature that is 5° C. to 50° C. higher than the conducting layer CVD deposition temperature is used during the hydrogen plasma treatment step. The purpose of the use of this elevated temperature is to lower the potential that heating during the subsequent conducting layer deposition step will drive the fluorine atoms from the bulk SiOF layer 16 into the fluorine-depleted layer 18.

The other parameters for the hydrogen plasma treatment step will be determined empirically. Typically, the pressure in the CVD chamber will be in the millitorr to torr range, the energy parameter will be in the several hundred watt range, and plasma treatment time will range from 20 seconds to several minutes. Optimized parameters will be determined based on the desired thickness of the depletion layer 18.

In a preferred embodiment, the depleted layer 18 is then passivated to form a passivation layer 20 which is less than the thickness of layer 18. One purpose of the passivation is to bond non-volatile atoms into the depleted layer 18 to lessen the potential for fluorine atoms from the bulk SiOF layer 16 diffusing up into the depleted layer 18 and thereafter reacting with the conducting layer atoms of the subsequently deposited layer 22. This passivation step may be carried out by switching to a pure $N_2$ plasma in the CVD chamber to form SiON to a thickness that is less than the thickness of the depletion layer 18. For example, the passivation layer 20 could have a thickness of 25 Angstroms or less, for example. Typically, a higher source power will be used in the CVD chamber, for example, 300–400 watts, to cause the nitrogen to bond with the SiO surface to yield an SiON dielectric barrier. This passivated dielectric barrier layer lessens the potential that fluorine atoms will diffuse up to the surface of layer 16 and react with, for example, a Ti or TiN barrier metal.

Note that less bias power (the bias power is different than the plasma power) and a higher pressure condition should be used to treat sidewalls and vias in the SiOF layer 16. For example, a bias power of less than 100 watts could be utilized. One purpose for the lower bias power is to make the plasma less directional so that it will affect the sidewalls.

The exact thickness of the passivation layer 20 may be optimized empirically. Note that a SIMS analysis may be performed to measure the thickness of the depletion layer 18 and the thickness of the passivation layer 20. Ultimately, optimization is achieved when the depletion and passivation layer thickness are such that it can be assumed that the subsequent layer 22 will not peel off during the remaining process steps for the semiconductor chip.

A typical device realized using the present invention method might have bulk SiOF layer 16 of 8,000 Angstroms to 15,000 Angstroms, with a depletion layer 18 of 50 Angstroms, and a passivation layer 20 of 25 Angstroms.

Next, a conducting layer 22 is deposited. By way of example, an in-situ deposition of optimized CVD-TiN may be accomplished in the previously mentioned CVD chamber using a nitrogen-rich initial layer. This deposition would then be followed by a standard blanket tungsten deposition to form a layer 24. Note that the present invention is not limited to TiN and Ta. A variety of metals are available to form these conducting layers, including Ti, TiN, Ta, Al, and Cu, for example.

It should be noted that although the present invention is particularly advantageous when used to form an SiOF inter-metal dielectric layer, it has application in any situation where the fluorine atoms in an SiOF layer are causing interaction and/or adhesion problems with other layers.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

We claim:

1. A method for using low dielectric SiOF in a process to manufacture semiconductor products, comprising the steps of:

obtaining a layer of SiOF;

depleting the fluorine from a surface of the SiOF layer, wherein said depleting step comprises the step of treating the surface of the SiOF layer with a plasma containing hydrogen to form a depleted region at a top portion of the SiOF layer;

passivating the depleted region to form a passivated region in the depleted region, the passivated region being a layer adjacent to and disposed directly above a remaining, non-passivated layer of the depleted region; and forming a conductive layer above said passivated region, the conductive layer being formed in a CVD deposition chamber, wherein the treating step is performed in the CVD deposition chamber at a temperature of from 5 to 50 degrees C. higher than a temperature used in the step of forming a conductive layer, so that a potential that heating during the step of forming the conductive layer will drive fluorine atoms from a non-fluorine-depleted region of said layer of SiOF into said depleted region is reduced, wherein hydrogen atoms in the plasma containing hydrogen bond with fluorine atoms in the SiOF layer to form HF, wherein the HF vaporizes and is evacuated from the CVD deposition chamber to thereby form the depleted region within the SiOF layer, and wherein the passivation step is performed using a nitrogen-containing plasma to bond non-volatile nitrogen atoms into the depleted region, and to reduce a potential for fluorine atoms from the SiOF layer and the depleted region diffusing through the passivated region, to thereby block the fluorine atoms from coming into contact with the conductive layer.

2. A method as defined in claim 1, wherein said passivating step comprises the step of applying substantially pure nitrogen plasma to the treated surface.

3. A method as defined in claim 1, wherein said depleting step forms a depletion layer that is greater than or equal to 30 Angstroms in thickness.

4. A method as defined in claim 1, wherein said passivating step comprises the step of forming a passivation layer that is less than or equal to 25 Angstroms in thickness.

5. A method as defined in claim 1, wherein said depleting step forms a depletion layer that is greater than or equal to 30 Angstroms in thickness, and wherein said passivating step comprises the step of forming a passivation layer that is less than or equal to 25 Angstroms in thickness.

6. A method as defined in claim 1, wherein said depleted region forms SiON.

7. A method as defined in claim 1, further comprising the step of, prior to the step of forming the conductive layer, forming at least one via in the depleted region,
   wherein the nitrogen-containing plasma is applied at the passivation step at a lower plasma bias power and a higher pressure than the hydrogen-containing plasma used in the treating step, and
   wherein the lower plasma bias power and the higher pressure used in the passivation step are provided so as to deposit the nitrogen-containing plasma on sidewalls of the at least one via and on a top surface of the depleted region.

8. A method as defined in claim 7, wherein a source power used in the CVD deposition chamber during the passivation step is in a range of from 300 to 400 watts,
   wherein a plasma bias power used in the passivation step is less than 100 watts to ensure a non-directional deposition of the nitrogen-containing plasma onto the depleted region, and
   wherein the source power is of a sufficient power such that nitrogen atoms of the nitrogen-containing plasma provided during the passivation step bond with SiO atoms of the depleted region to form an SiON barrier.

* * * * *

UNITED STATES PATENT AND TRADEMARK OFFICE
CERTIFICATE OF CORRECTION

PATENT NO. : 6,335,273 B2
DATED : January 1, 2002
INVENTOR(S) : Richard J. Huang et al.

It is certified that error appears in the above-identified patent and that said Letters Patent is hereby corrected as shown below:

<u>Title page,</u>
Item [62], should read as follows:
-- (62) Division of application No.09/157,240, filed on Sept. 18, 1998, now Pat. No. 5,994,778. --

Signed and Sealed this

Fourth Day of June, 2002

Attest:

Attesting Officer

JAMES E. ROGAN
Director of the United States Patent and Trademark Office